United States Patent
Mohamad et al.

(10) Patent No.: US 12,136,667 B2
(45) Date of Patent: Nov. 5, 2024

(54) TRANSISTOR (71) Applicant: Commissariat à l'Énergie Atomique et aux Énergies Alternatives, Paris (FR)

(72) Inventors: Blend Mohamad, Grenoble (FR); René Escoffier, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 382 days.

(21) Appl. No.: 17/668,254

(22) Filed: Feb. 9, 2022

(65) Prior Publication Data
US 2022/0262938 A1 Aug. 18, 2022

(30) Foreign Application Priority Data
Feb. 16, 2021 (FR) ....................................... 2101480

(51) Int. Cl.
H01L 21/00 (2006.01)
H01L 29/423 (2006.01)
H01L 29/66 (2006.01)
H01L 29/778 (2006.01)
H01L 21/8258 (2006.01)
H01L 27/088 (2006.01)

(52) U.S. Cl.
CPC ...... *H01L 29/7783* (2013.01); *H01L 29/4236* (2013.01); *H01L 29/66462* (2013.01); *H01L 29/7788* (2013.01); *H01L 21/8258* (2013.01); *H01L 27/088* (2013.01)

(58) Field of Classification Search
CPC ............. H01L 29/7783; H01L 29/4236; H01L 29/66462; H01L 29/7788; H01L 21/8258; H01L 27/088
See application file for complete search history.

(56) References Cited

U.S. PATENT DOCUMENTS

| 7,675,112 B2 * | 3/2010 | Lee .................... H01L 29/66621 257/296 |
| 2014/0077267 A1 | 3/2014 | Heo |
| 2014/0239311 A1 | 8/2014 | Kawai et al. |
| 2014/0312414 A1 * | 10/2014 | Cheng ............... H01L 29/41741 257/334 |

FOREIGN PATENT DOCUMENTS

| JP | 2014-192167 A | 10/2014 |
| JP | 6507983 B2 | 5/2019 |

OTHER PUBLICATIONS

Preliminary Search Report for French Application No. 2101480, dated Oct. 15, 2021.

* cited by examiner

*Primary Examiner* — Richard A Booth
(74) *Attorney, Agent, or Firm* — Wolf, Greenfield & Sacks, P.C.

(57) ABSTRACT

A device including a first transistor, having a gate region partially penetrating into a gallium nitride layer, and a second transistor located inside of the gate region of the first transistor.

11 Claims, 4 Drawing Sheets

TRANSISTOR

The present application claims the priority benefit of French patent application 21/01480, filed on Feb. 16, 2021, and entitled "Transistor" which is herein incorporated by reference.

TECHNICAL BACKGROUND

The present disclosure generally concerns electronic devices. The present disclosure more particularly concerns normally-off high electron mobility transistors (HEMT), or HEMT transistors, based on gallium nitride (GaN) and methods of manufacturing such transistors.

PRIOR ART

Normally-off HEMT transistors based on gallium nitride are currently used in electric energy conversion applications, for powers typically in the range from a few milliwatts to several tens of watts. There exist several types of normally-off HEMT transistors, particularly HEMT transistors comprising an insulated gate of metal-insulator-semiconductor (MIS) type, or MIS-HEMT transistors. Such transistors generally have a strong on-state resistance, which adversely affect their performance.

SUMMARY

There is a need to improve existing normally-off insulated gate high electron mobility transistors based on gallium nitride.

An embodiment overcomes all or part of the disadvantages of existing normally-off high electron mobility transistors based on gallium nitride.

An embodiment provides a device comprising a first transistor, having a gate region partially penetrating into a gallium nitride layer, and a second transistor located inside of the gate region of the first transistor.

According to an embodiment, a conductive material extends along a first side of a vertical portion of the gate region of the first transistor and contacts a first doped region of the second transistor of a first conductivity type.

According to an embodiment, the conductive material further extends along a second side, opposite to the first side, of the vertical portion of the gate region of the first transistor and contacts a second doped region of the second transistor, of the first conductivity type.

According to an embodiment, the second region is separated from the first region by a third channel region of the second transistor, non-intentionally doped or doped with a second conductivity type opposite to the first conductivity type.

According to an embodiment, the first transistor comprises a first gate electrode located above the second transistor and insulated from the second transistor by an insulating layer.

According to an embodiment, the first transistor further comprises second and third electrodes, located on either side of the first electrode and partially penetrating into the gallium nitride layer, the second electrode being closer to the first electrode than the third electrode and the first side being located on the side of the second electrode.

According to an embodiment, the conductive material extending along the first side extends all the way to the second electrode.

According to an embodiment, the first electrode is planar and located on top of and in contact with the insulating layer, a first side of the second transistor being coated with the conductive material.

According to an embodiment, the second transistor occupies the vertical portion of the gate region of the first transistor.

According to an embodiment, the first electrode partially penetrates into the gallium nitride layer, a first side of the first electrode being coated with the insulating layer and with the conductive material.

According to an embodiment, the second transistor is located in a lower portion of the gate region of the first transistor.

An embodiment provides a method of manufacturing a device such as described, the method comprising the steps of:
  a) forming a trench inside of a gallium nitride layer;
  b) coating a first side of the trench with a conductive layer;
  c) forming the second transistor inside of the trench;
  d) depositing an insulating layer coating the conductive layer and the second transistor; and
  e) forming a first gate electrode of the first transistor above the second transistor.

According to an embodiment, at step b), a second side of the trench, opposite to the first side, is coated with the conductive layer.

According to an embodiment, at step c), the second transistor partially fills the trench.

According to an embodiment, at step c), the second transistor fills the trench.

BRIEF DESCRIPTION OF THE DRAWINGS

The foregoing and other features and advantages of the present invention will be discussed in detail in the following non-limiting description of specific embodiments and implementation modes in connection with the accompanying drawings, in which.

DESCRIPTION OF THE EMBODIMENTS

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and will be detailed. In particular, the applications and devices likely to take advantage of the described transistors are not detailed, the described embodiments and implementation modes being compatible with usual applications and devices comprising high electron mobility gallium nitride transistors.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the terms "about", "approximately", "substantially", and "in the order of" signify within 10% or 10°, preferably within 5% or 5°.

In the following description, unless specified otherwise, the terms insulating and conductive respectively signify electrically insulating and electrically conductive.

Figure 1:
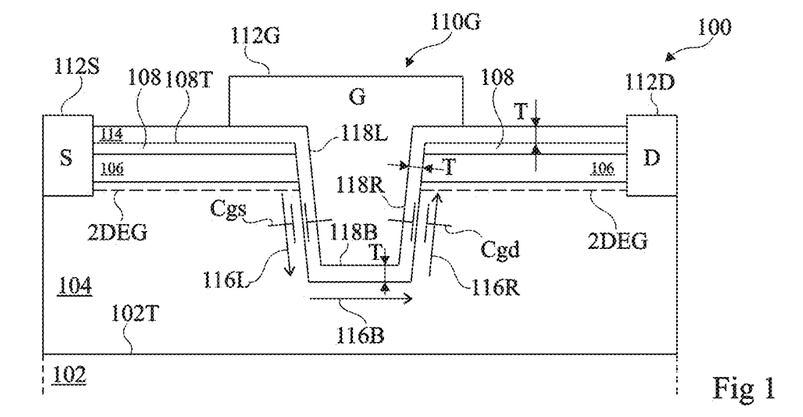
FIG. 1 is a partial simplified cross-section view of an example of a transistor.

FIG. 1 is a partial simplified cross-section view of an example of a high electron mobility transistor (HEMT) 100, or HEMT transistor. HEMT transistor 100 is normally off in this example.

In the shown example, HEMT transistor 100 is formed on a substrate 102. Substrate 102 is for example a wafer, or a wafer piece, a single portion of which is shown in FIG. 1. As an example, substrate 102 is made of a semiconductor material, for example, silicon, or of glass, of sapphire, etc.

In the orientation of FIG. 1, a layer 104 coats an upper surface 102T of substrate 102. As an example, layer 104 is made of gallium nitride (GaN), for example, of intrinsic, that is, non intentionally doped, gallium nitride.

In the shown example, another layer 106 coats an upper surface of layer 104. As an example, layer 106 is made of aluminum-gallium nitride (AlGaN).

In the shown example, still another layer 108 coats an upper surface of layer 106. As an example, layer 108 is made of silicon nitride (SiN).

Transistor 100 comprises a gate region 110G. The gate region 110G of transistor 100 is said to be recessed in gallium nitride layer 104. More precisely, in the shown example, gate region 110G extends vertically, from an upper surface 108T of layer 108, towards the upper surface 102T of substrate 102. Each layer 106, 108 thus comprises two separate portions, located on either side of gate region 110G.

In the shown example, the gate region 110G of transistor 100 comprises a gate electrode 112G (G). Electrode 112G has a T-shaped cross-section, having a vertical portion crossing layers 108 and 106 and partially penetrating into the thickness of layer 104. Further, a horizontal portion of the T formed by gate electrode 112G extends above layer 108.

In the shown example, the sides of the vertical portion of the T formed by gate electrode 112G are inclined so that they come closer to each other at the bottom of electrode 112G. This enables to facilitate the flowing of electrons from one side to the other of electrode 112G.

Gate electrode 112G is made of a conductive material. As an example, electrode 112G is made of a metal or of a metal alloy, for example, an alloy based on titanium nitride (TiN) and on tungsten (W).

In the shown example, still another layer 114 insulates electrode 112G from layers 104, 106, and 108. Layer 114 is made of an insulating material. As an example, layer 114 is made of alumina ($Al_2O_3$).

Insulating layer 114 coats the lateral surfaces and the lower surface of the vertical portion of the T formed by electrode 112G. This lower surface is also called bottom of electrode 112G. Further, insulating layer 114 laterally extends on either side of the vertical portion and under the horizontal portion of the T formed by electrode 112G. Layer 114 extends on top of and in contact with the upper portion 108T of layer 108.

In the shown example, the horizontal portion of the T formed by electrode 112G extends on top of and in contact with portions of layer 114. These portions of layer 114 are thus vertically interposed between layer 108 and the horizontal portion of the T formed by electrode 112G.

The portions of layer 114 located vertically in line with gate electrode 112G are considered as forming part of the gate region 110G of transistor 100.

In the shown example, insulating layer 114 has a substantially constant thickness T. As an example, the thickness T of layer 114 is equal to approximately 30 nm, to within plus or minus 20%. This enables to properly insulate gate electrode 112C with respect to gallium nitride layer 104 while keeping a relatively low threshold voltage Vth, for example, in the order of 1 V.

Transistor 100 further comprises two other electrodes 112S and 112D. Electrodes 112S and 112D are located on either side of the gate electrode 112G of transistor 100. Electrode 112S is for example closer to gate electrode 112G than electrode 112D. The electrodes 112S, 112G, and 112D of transistor 100 extend perpendicularly to the cross-section plane of FIG. 1, along a direction commonly called width (W) of transistor 100. The cross-section plane of FIG. 1 is thus oriented parallel to another direction commonly called length (L) of transistor 100 and perpendicularly to the upper surface 108T of layer 108.

As an example:

electrode 112S is separated from electrode 112G by a distance in the range from 1 to 2 µm, for example, equal to approximately 1 µm; and electrode 112D is separated from electrode 112G by a distance in the range from 10 to 20 µm, for example, equal to approximately 10 µm, to ensure a breakdown voltage for example ranging up to 1,000 V (the maximum electric field in GaN theoretically is 2 MV/cm, but it is in practice for example limited to 1 MV/cm by the quality of GaN layer 104).

In the shown example, electrodes 112S and 112D each vertically extend, from the upper surface of insulating layer 114, towards the upper surface 102T of substrate 102. More precisely, in the shown example, electrodes 112S and 112D each cross layers 114, 108, and 106 and partially penetrate into the thickness of layer 104.

Electrodes 112S and 112D are each made of a conductive material, for example, a metal or a metal alloy. Electrodes 112S and 112D are for example made of the same material as electrode 112G.

As an example, when transistor 100 is operating, electrode 112S is a source electrode (S) and electrode 112D is a drain electrode (D). Electrode 112D being more distant from electrode 112G than electrode 112S, this enables to apply a high potential, for example in the order of 650 V, on electrode 112D with no risk of breakdown of transistor 100, electrodes 112S and 112G being generally submitted to potentials in the order of a few volts.

In HEMT transistor 100, a two-dimensional electron gas (2DEG), symbolized in FIG. 1 by a dotted line, forms inside of layer 104 close to an interface between layers 104 and 106. The electrodes 112S and 112D of HEMT transistor 100 are each in contact with the two-dimensional electron gas 2DEG.

In the shown example where HEMT transistor 100 is normally off, the two-dimensional electron gas 2DEG is interrupted by gate region 110G. More precisely, in this example, the two-dimensional electron gas 2DEG is discontinuous and comprises two portions located on either side of the gate region 110G of transistor 100 (on the left-hand side and on the right-hand side of region 110G, in the orientation of FIG. 1).

When a substantially zero voltage Vgs is applied between gate electrode 112G and source electrode 112S, the gate region 110G recessed in gallium nitride layer 104 prevents electrons from flowing between source electrode 112S and drain electrode 112D. Transistor 100 then is in an off state.

However, when the voltage Vgs applied between gate electrode 112G and source electrode 112S exceeds the threshold voltage Vth of transistor 100, electrons may flow between source electrode 112S and drain electrode 112D. Transistor 100 then is in a conductive state.

In the conductive state, electrons flow from one portion to the other of the two-dimensional electron gas 2DEG around gate region 110G. More precisely, when transistor 100 is conductive and submitted to a bias voltage applied between its drain D and its source S, the electrons then follow, to flow from one side to the other of gate G, a conduction path located inside of layer 104 along an interface between layer 104 and insulating layer 114.

The conduction path followed by the electrons to bypass gate region 110G is symbolized, in FIG. 1, by arrows 116L, 116B, and 116R. More particularly, in the orientation of FIG. 1:

arrow 116L symbolizes a path followed by the electrons to flow down along a first side 118L of gate electrode 112G located on the side of source electrode 112S;

arrow 116B symbolizes a path followed by the electrons to displace horizontally under the bottom 118B of gate electrode 112G; and arrow 116R symbolizes a path followed by the electrons to flow up along a second side 118R of gate electrode 112G opposite to side 118L, located on the side of drain electrode 112D.

Although this has not been shown in FIG. 1, transistor 100 may further comprise other elements such as insulating layers coating layer 114 and/or a portion of gate electrode 112G, field plates, contacting elements, etc.

A disadvantage of HEMT transistors similar to transistor 100 lies in the fact that they have, in the conductive state, a high on-state drain-source resistance Ron which strongly degrades their electric performance. This is particularly due to resistances associated with the conduction path 116L, 116B, and 116R followed by the electrons to bypass gate region 110G.

To decrease the on-state resistance Ron of transistor 100 it may be devised to provide a structure where insulating layer 114 would be omitted and where gate electrode 112G would not penetrate into gallium nitride layer 104. This would for example amount to ascertaining that electrode 112G stops in the thickness of layer 106, before the interface between layer 106 and layer 104. A Schottky-type gate, which would enable to locally interrupt or attenuate the two-dimensional electron gas 2DEG vertically in line with gate electrode 112G to obtain a normally-off transistor, would then be formed. However, this would not enable to reach a threshold voltage Vth greater than approximately 1 V, which is a problem for most applications using HEMT transistors.

It may further be devised to form a structure where gate region 110G would not be recessed in layers 108, 106, and 104. This would for example amount to forming gate electrode 112G on top of and in contact with layer 108. As an example, an implantation of fluorine ions (Ft) may in particular be provided in layer 106, vertically in line with gate electrode 112G, which would result in attenuating or in interrupting the two-dimensional electrons gas 2DEG under the gate of transistor 100. This would however tend to complicate a control of threshold voltage Vth.

It could as an alternative be provided to omit layer 114, to form gate electrode 112G above layer 108, and to interpose a P-type doped gallium nitride layer (p-GaN) between the gate electrode and layer 108. However, this would not enable to reach a threshold voltage Vth sufficiently high for the targeted applications.

It could further be devised to decrease the width of the lower surface 118B of the vertical portion of the T formed by gate region 110G, to decrease the length of horizontal conduction path 116B. However, this would not enable to significantly decrease the on-state resistance Ron of transistor 100.

Another disadvantage of HEMT transistors similar to transistor 100 lies in the fact that they have, on either side of gate region 110G, parasitic capacitive elements Cgs and Cgd. Capacitive element Cgs more precisely corresponds to a parasitic capacitive element between the portion of the two-dimensional electron gas 2DEG located on the side of source electrode 112S (the left-hand portion of the two-dimensional electron gas 2DEG, in the orientation of FIG. 1) and side 118L of gate electrode 112G. Capacitive element Cgd more precisely corresponds to another parasitic capacitive element between the portion of the two-dimensional electron gas 2DEG located on the side of drain electrode 112D (the right-hand portion of the two-dimensional electron gas 2DEG, in the orientation of FIG. 1) and side 118R of gate electrode 112G. Capacitive elements Cgs and Cgd adversely affect the operation of transistor 100 particularly at high switching frequencies, for example in the range from one hundred kilohertz to several megahertz.

Figure 2:
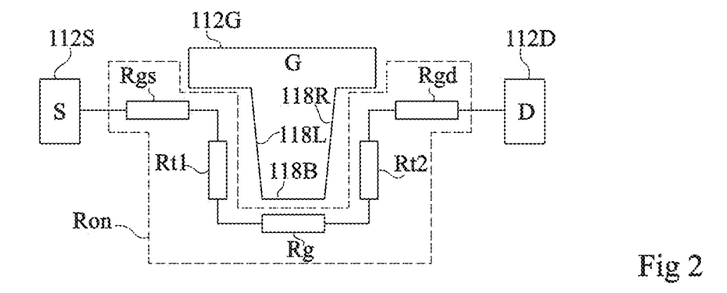
FIG. 2 is an electric diagram equivalent to the transistor of FIG. 1.

FIG. 2 is an electric diagram equivalent to the transistor 100 of FIG. 1.

As illustrated in FIG. 2, the on-state resistor Ron of transistor 100, between its source terminal 112S and its drain terminal 112D, may be broken down into:

a resistor Rg, corresponding to a conduction path following the portion of the two-dimensional electron gas 2DEG located between source electrode 112S and gate electrode 112G;

another resistor Rt1, corresponding to the conduction path 116L followed by the electrons to flow down along side 118L of electrode 112G;

still another resistor Rg, corresponding to the conduction path 116B followed by the electrons to horizontally displace under the bottom 118B of electrode 112G;

still another resistor Rt2, corresponding to the conduction path 116R followed by the electrons to flow up along side 118R of electrode 112G; and still another resistor Rgd, corresponding to a conduction path following the portion of the two-dimensional electron gas 2DEG located between gate electrode 112G and drain electrode 112D.

Resistors Rgs, Rt1, Rg, Rt2, and Rgd, the series association of which is equivalent to resistor Ron (neglecting the source and drain ohmic contact resistances), adversely affect the operation of transistor 100 as previously discussed in relation with FIG. 1. In particular, resistor Rt1 generally has a significant value, which modifies the on-state resistance of transistor 100.

Figure 3:
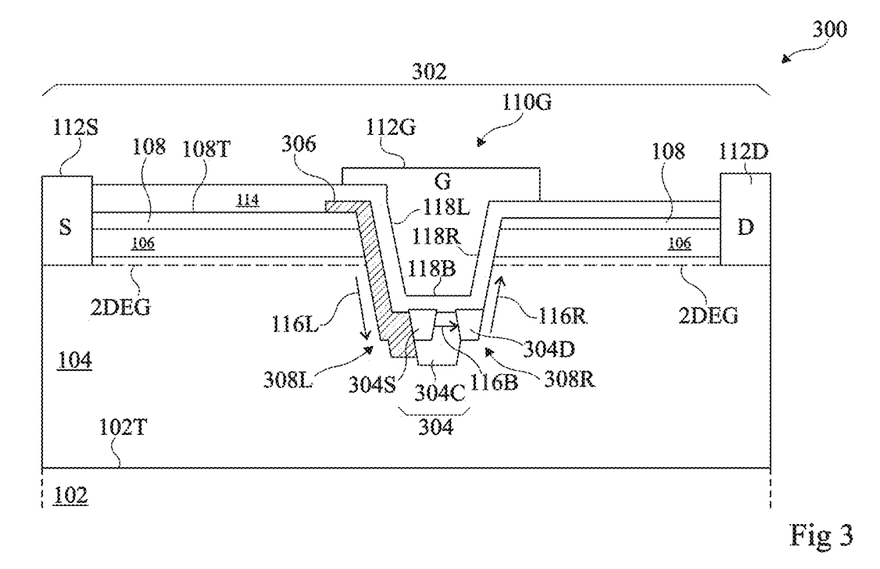
FIG. 3 is a partial simplified cross-section view of a device comprising a transistor according to a first embodiment.

FIG. 3 is a partial simplified cross-section view of a device 300 comprising a first transistor 302 according to a first embodiment.

The transistor 302 of FIG. 3 comprises elements common with the transistor 100 of FIG. 1. These common elements will not be described again. In particular, transistor 302 comprises, like transistor 100, substrate 102 having its upper surface 102T coated with gallium nitride layer 104, aluminum-gallium nitride layer 106, and silicon nitride layer 108. Transistor 302 further comprises gate region 110G and electrodes 112S, 112G, and 112D previously described in relation with the transistor 100 of FIG. 1.

According to this embodiment, device 300 further comprises a second transistor 304 located inside of the gate region 110G of first transistor 302. In the shown example, transistor 304 is located under the gate electrode 112G of transistor 302. Transistor 304 is for example insulated from the gate electrode 112G of transistor 302 by insulating layer 114. Layer 114 is for example interposed between the gate electrode 112G of transistor 302 and transistor 304.

In the shown example, transistor 304 comprises a first doped source region 304S, of a first conductivity type, and a second doped drain region 304D, of the first conductivity type. First source region 304 is for example separated from second drain region 304D by a third channel region 304C. Third channel region 304C is for example made of an intrinsic, that is, non intentionally doped, semiconductor material, or of a lightly-doped semiconductor material of a second conductivity type opposite to the first conductivity type. The second transistor 304 of device 300 is preferably a MOS ("Metal-Oxide-Semiconductor") transistor based on silicon, or silicon MOS transistor. As an example, channel region 304C is made of intrinsic polysilicon (poly-Si) and the source 304S and drain 304D regions of transistor 304 are made of N-type doped polysilicon.

In the shown example, the side 118L of gate electrode 112G is coated with insulating layer 114 and with a conductive material 306. Conductive material 306 integrally coats a side of source region 304S located on the side of the source electrode 112S of first transistor 302. Further, in the shown example, material 306 partially coats a side of channel region 304C located on the side of the source electrode 112S of first transistor 302. In this example, the bottom 118B and the side 118R of the gate electrode 112G of transistor 302 are also coated with insulating layer 114, but are not coated with conductive material 306.

In the shown example, conductive material 306 extends on top of and in contact with the upper surface 108T of layer 108. In this example, conductive material 306 continues towards source electrode 112S vertically in line with gate electrode 112G without contacting source electrode 112S. The conductive material further coats a side of transistor 304 located approximately in line with the side 118L of the gate electrode 112G of transistor 302, on the side of source electrode 112S. In the shown example, the conductive material 306 coating the side 118L of electrode 112G contacts the source region 304S of transistor 304.

As an example, conductive material 306 has a thickness in the range from 5 to 10 nm.

Conductive material 306 is for example a metal, a metal alloy or an N-type doped semiconductor. As an example, conductive material 306 is aluminum (Al), gold (Au), copper (Cu), or titanium nitride (TiN).

In the shown example, gate region 110G exhibits shoulders, or steps. More precisely, the conductive material 306 located on the side 118L of gate electrode 112G exhibits a shoulder 308L. A similar shoulder 308R is located on the side 118R of gate electrode 112G, at the level of the drain region 304D of transistor 304.

In this example, shoulders 308L and 308R are located in gallium nitride layer 104, close to the bottom 118B of gate electrode 112G. As compared with the transistor 100 of FIG. 1, this enables to smooth an electric field originating from a biasing of drain electrode 112D with respect to gate electrode 112G. In other words, each shoulder 308L, 308R plays a role similar to that of a field plate.

As a variant, shoulders 308L and 308R are omitted.

In device 300, the channel region 304C of transistor 304 is reverse-biased when the voltage Vgs between gate electrode 112G and source electrode 112S exceeds the threshold voltage Vth of transistor 304. The electrons which transit from source S to drain D of transistor 302 first flow via a first electron gas portion 2DEG located at the interface between layers 104 and 106, then cross the conductive material 306 via path 116L, and then the source 304S, channel 304C, and drain 304D of transistor 304. Eventually, the electrons rise along path 116R along side 118R, and then join the drain 112D of transistor 302 via a second electron gas portion 2DEG located at the interface between layers 104 and 106. The conduction path 116B taken by the electrons to horizontally displace under the bottom 118B of gate electrode 112G is in this case located in channel region 304C, between the source 304S and drain 304D regions of transistor 304, and no longer in gallium nitride layer 104 as in the case of the transistor 100 of FIG. 1.

Device 300 can be considered as being equivalent to a silicon MOS transistor 304 in series with a vertical gate HEMT transistor 302. A setting to the conductive state of a general transistor, corresponding to the series association of transistors 304 and 302, is thus controlled by a simultaneous setting to the conductive state of silicon MOS transistor 304 and of vertical HEMT transistor 302. The fact for side 118R of gate electrode 112G not to have conductive material 306 advantageously enables to avoid applying a drain potential, present at electrode 112D, directly on the drain region 304D of MOS transistor 304. MOS transistor 304 is thus protected against high drain voltages which are present before electron gas 2DEG is depleted between side 118R of gate 112D and drain 112D.

An advantage of the embodiment of the device 300 discussed in relation with FIG. 3 lies in the fact that conductive material 306 borders side 118L of gate electrode 112G. This enables electrons to more easily flow around the gate region 110G of transistor 302. Conductive material 306 particularly enables electrons to more easily flow down along side 118L. In device 300, the presence of conductive material 306 along side 118L of electrode 112G more precisely enables, as compared with the transistor 100 of FIG. 1, to avoid a mobility drop due to interface states and to trap levels close to the interface between layer 104 and gate region 110G.

The trapping of electrons for example results in a hysteresis problem, for example observable on curves of variation of a drain current Id according to the voltage Vgs applied between gate and source electrodes 112G and 112S (curves Id(Vgs)). The trapping further causes a strong attenuation (collapse) of drain current Id after the biasing of transistor 100, for example observable on curves of drain current Id versus a voltage Vds applied between drain and source electrodes 112D and 112S (curves Id(Vds)). In the case of device 300, the electron trapping phenomenon is strongly decreased along conduction path 116L since electrons preferably flow through conductive material 306 rather than through layer 104.

Another advantage of this embodiment results from the presence of second transistor 304 inside of the gate region 110G of first transistor 302. This allows a better control of the threshold voltage Vth of device 300. As an example, device 300 has a threshold voltage Vth greater than approximately 1.5 V.

Still another advantage of the device 300 lies in the fact that the resistance Rt1 (FIG. 2) of transistor 302 is substantially zero due to the presence of conductive material 306 along side 118L of gate electrode 112G. The on-state resistance Ron of transistor 302 is thus lower than that of transistor 100. In the transistor 100 of FIG. 1, the electrons have a low mobility along conduction path 116L. As an example, the mobility of electrons in transistor 100, that is, in the absence of conductive material 306, is in the order of 200 cm$^2$/(V.s) along conduction path 116L and approximately 2,000 cm$^2$/(V.s) in the two-dimensional electron gas 2DEG. The fact of providing conductive material 306 along side 118L of the gate electrode 112G of transistor 302 enables to obtain, along conduction path 116L, an electron mobility much greater than that of transistor 100, for example substantially equal to the mobility in the two-dimensional electron gas 2DEG.

It could have been devised to provide a cascode-type assembly, where second transistor 304 would be associated in series with first transistor 302, the drain of transistor 304 being connected to the source of transistor 302, and where the source of transistor 304 would be connected to the gate of transistor 302. Such a device would however occupy a surface area approximately 20% larger than that occupied by device 300, where transistor 304 is integrated in the gate region 110G of transistor 302. Device 300 however does not require providing a silicon chip combined with a gallium nitride chip. The embodiment described in relation with FIG. 3 thus allows an advantageous size decrease.

Figure 4:
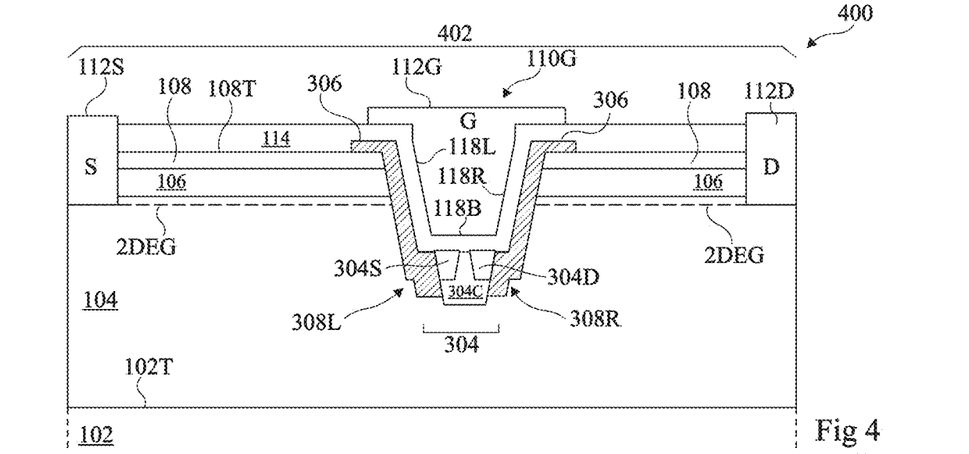
FIG. 4 is a partial simplified cross-section view of a device comprising a transistor according to a second embodiment.

FIG. 4 is a partial simplified cross-section view of a device 400 comprising a transistor 402 according to a second embodiment. The transistor 402 of the device 400 of FIG. 4 comprises elements common with the transistor 302 of the device 300 of FIG. 3. These common elements will not be described again hereafter.

Transistor 402 differs from transistor 302 mainly in that side 118R of gate electrode 112G is further coated with conductive material 306.

More precisely, in the shown example:
insulating layer 114 extends in contact with electrode 112G along side 118R; and
conductive material 306 extends in contact with insulating layer 114 along side 118R of electrode 112G.

In this example, conductive material 306 forms two separate layer portions, located on either side of the bottom 118B of electrode 112G. The conductive material 306 located on side 118L is separated from the conductive material 306 located on side 118R by transistor 304. In the shown example, the conductive material 306 coating side 118R of electrode 112G contacts the drain region 304D of transistor 304.

In the shown example, gate region 110G exhibits shoulders 308L and 308R for the same reasons as previously. In this example, shoulder 308R is formed in the conductive material 306 located on side 118R of gate electrode 112G.

As a variant, shoulders 308L and 308R are omitted.

An advantage of device 400 lies in the fact that conductive material 306 borders side 118R of the gate electrode 112G of transistor 402. This enables electrons to more easily flow around gate region 110G. More precisely, conductive material 306 enables electrons to more easily flow up along side 118R. In device 400, the presence of conductive material 306 along side 118R of electrode 112G enables, as compared with the device 300 of FIG. 3, to further avoid the mobility drop due to the interface states and to the trap levels close to the interface between layer 104 and gate region 110G.

As compared with the device 300 of FIG. 3, the resistance Rt2 (FIG. 2) of device 400 is substantially zero due to the presence of conductive material 306 along side 118R of gate electrode 112G.

The on-state resistance Ron of transistor 400 is thus even lower than that of transistor 300. The fact of providing conductive material 306 along side 118R of the gate electrode 112G of transistor 402 enables to obtain, along conduction path 116R, an electron mobility for example substantially equal to the mobility in the two-dimensional electron gas 2DEG.

Figure 5:
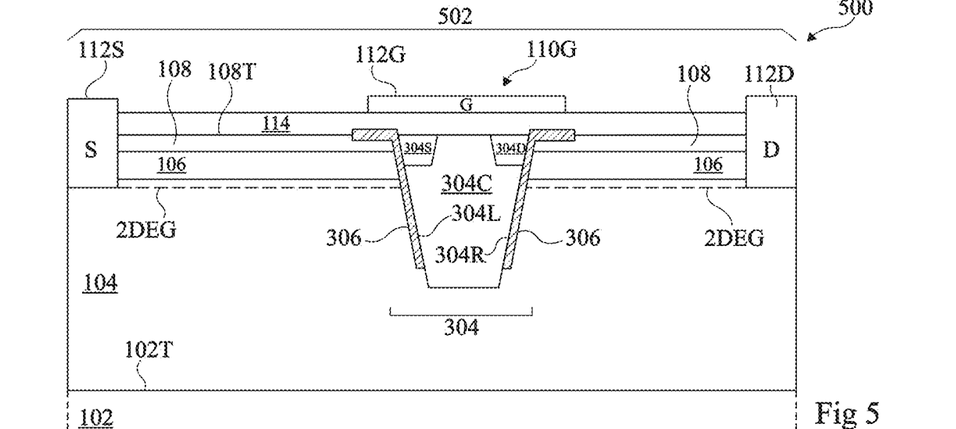
FIG. 5 is a partial simplified cross-section view of a device comprising a transistor according to a third embodiment.

FIG. 5 is a partial simplified cross-section view of a device 500 comprising a transistor 502 according to a third embodiment. The transistor 502 of the device 500 of FIG. 5 comprises elements common with the transistor 402 of the device 400 of FIG. 4. These common elements will not be described again hereafter.

Transistor 502 differs from transistor 402 mainly in that gate electrode 112G does not penetrate into layers 108, 106, and 104. In the shown example, gate electrode 112G is a planar electrode located on top of and in contact with insulating layer 114. Insulating layer 114 is, in this example, a planar layer.

As compared with device 400, the vertical portion of the T formed by gate electrode 112G is replaced, in device 500, with transistor 302. In the shown example, the transistor 304 located inside of gate region 112G extends vertically, from the upper surface 108T of layer 108, through layers 108 and 106 and partially penetrates into the thickness of layer 104. Advantageously, channel region 304C crosses layer 106 and partially penetrates into layer 104, while source 304S and drain 304D regions do not penetrate into layer 104.

As an example, transistor 304 extends under layer 106 at a depth in the range from 40 to 200 nm, for example, equal to approximately 50 nm.

In the shown example, conductive material 306 coats a side 304L of transistor 304 located on the side of the source electrode 112S of transistor 502. Conductive material 306 further coats another side 304R of transistor 304 located on the side of the drain electrode 112D of transistor 502. The conductive material 306 coating side 304L contacts the source region 304S of transistor 304. The conductive material 306 of side 304L more precisely coats sides of source region 304S and of channel region 304C located on the side of electrode 112S. Similarly, the conductive material 306 coating side 304R contacts the drain region 304D of transistor 304. More precisely, the conductive material 306 of side 304R coats sides of drain region 304D and of channel region 304C located on the side of electrode 112D. In this example, the conductive material 306 coating side 304R is separated from conductive material 306 coating side 304L by transistor 304. The source 304S and drain 304D regions of transistor 304 extend, for example vertically, under insulating layer 114.

In the shown example, shoulders 308L and 308R are omitted. More precisely, in this example, neither the conductive material 306 located on side 118L of gate electrode 112G, nor the conductive material 306 located on the side 118R of gate electrode 112G, exhibits a shoulder. As a variant, device 400 exhibits shoulders, for example, similar to the shoulders 308L and 308R of devices 300 and 400.

Although this has not been shown in FIG. 5, the bottom of gate region 110G may be made of silicon oxide (SiO2).

An advantage of the device 500 of FIG. 5 lies in its ease of implementation, since doped portions 304S and 304D are located at the surface and are sufficiently distant to facilitate an alignment of implantation masks.

Figure 6:
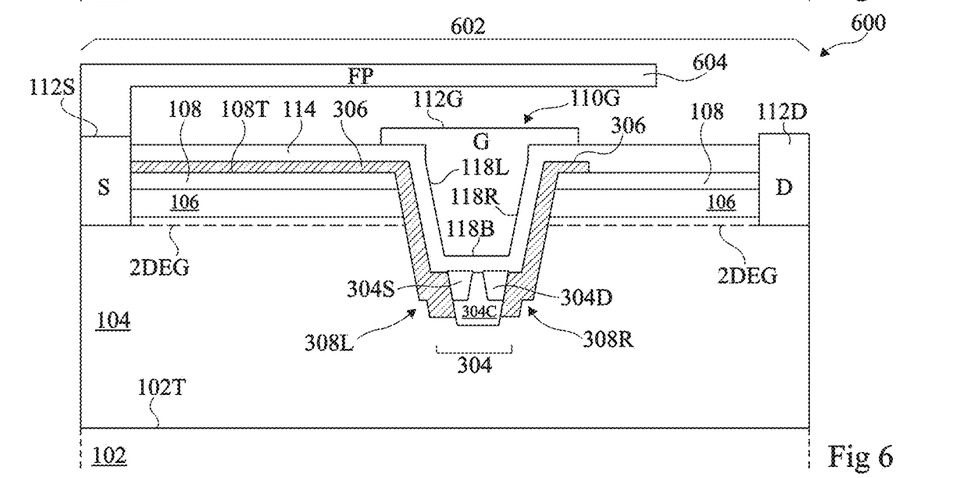
FIG. 6 is a partial simplified cross-section view of a device comprising a transistor according to a fourth embodiment.

FIG. 6 is a partial simplified cross-section view of a device 600 comprising a transistor 602 according to a fourth embodiment. The transistor 602 of FIG. 6 comprises elements common with the transistor 402 of FIG. 4. These common elements will not be described again.

Transistor 602 differs from transistor 402 mainly in that the conductive material 306 located on side 118L of electrode 112G of transistor 602 is connected to source electrode 112S. More precisely, the conductive material layer portion 306 located on side 118L extends, on top of and in contact with the upper surface 108T of layer 108, all the way to electrode 112S. The conductive material layer portion 306 located on side 118L thus has, in the vicinity of the bottom 118B of electrode 112G, a potential substantially equal to that of source electrode 112S, for example, the ground (0 V).

In the shown example, device 600 comprises a source field plate 604 (FP). In this example, field plate 604 contacts source electrode 112S and extends horizontally above gate region 110G towards drain electrode 112D. Although this is not shown in FIG. 6, field plate 604 is for example separated from insulating layer 114 and from gate electrode 112G by one or a plurality of other insulating layers.

An advantage of the embodiment of device 600 discussed hereabove in relation with FIG. 6 lies in the fact that conductive material 306 extends from source electrode 112S to the vicinity of the bottom 118B of gate electrode 112G. This enables electrons to more easily flow between source electrode 112S and the bottom 118B of electrode 112G. Due to the fact that conductive material 306 extends all the way to electrode 112S, a conduction path more favorable than that running through the two-dimensional electron gas 2DEG located in gallium nitride layer 104 is particularly obtained.

As compared with the transistor 400 of FIG. 4, the resistance Rgs of transistor 602 is substantially zero due to the connection between the conductive material located along side 118L of gate electrode 112G and source electrode 112S. In the case of transistor 602, the extension of conductive material 306 all the way to electrode 112S enables to limit or to avoid problems of ohmic contact between the two-dimensional electron gas 2DEG and the conductive material 306 located on side 118L of gate electrode 112G. This further allows a better electrostatic control between gate and source, and thus a greater efficiency of control Vgs of transistor 602.

The on-state resistance Ron of transistor 602 is thus even lower than that of transistor 402.

As a variant, it may be provided to omit the portion of the layer of conductive material 306 which coats side 118R of electrode 112G and to only keep the portion of the layer of conductive material 306 which coats side 118L of electrode 112G and which extends all the way to electrode 112S. This for example amounts, starting from the device 300 of FIG. 3, to extending the portion of layer of conductive material 306 located on side 118L all the way to electrode 112S. This variant has advantages identical or similar to those of the device 600 of FIG. 6.

FIGS. 7 to 14 hereafter illustrate successive steps of an example of an implementation mode of a method of forming the device 600 of FIG. 6.

Figure 7:
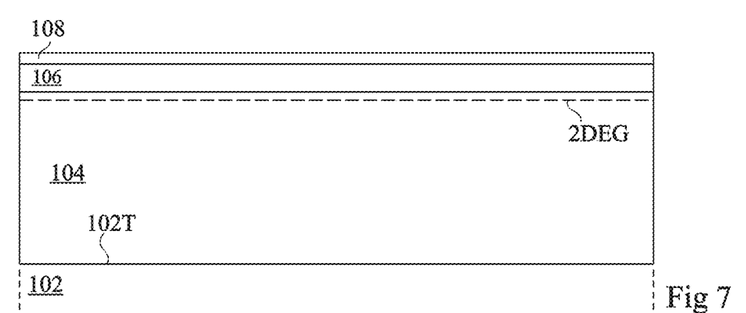
FIG. 7 is a partial simplified cross-section view illustrating a step of an implementation mode of a method of forming the device of FIG. 6.

FIG. 7 is a partial simplified cross-section view illustrating a step of the implementation mode of the method of forming the device 600 of FIG. 6.

During this step, layer 104, layer 106, and layer 108 are successively formed, in this order, on the side of surface 102T of substrate 102. More precisely:

layer 104 extends continuously and over the entire upper surface 102T of substrate 102;

layer 106 extends continuously and over the entire upper surface of layer 104; and layer 108 extends continuously and over the entire upper surface of layer 106.

Layers 104, 106, and 108 are for example formed by epitaxy. Although this is not shown in FIG. 7, an intermediate aluminum nitride layer may be interposed between layers 104 and 106. In this case, this enables to favor the epitaxy of aluminum-gallium nitride layer 106 on gallium nitride layer 104 by lattice parameter matching.

In FIG. 7, the two-dimensional electron gas 2DEG extends laterally and continuously in layer 104, under the interface between layers 104 and 106.

Figure 8:
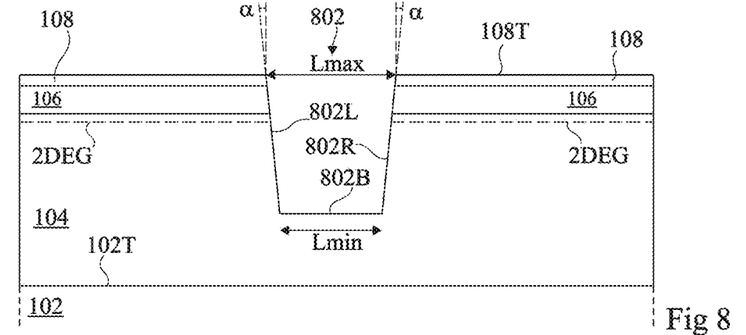
FIG. 8 is a partial simplified cross-section view illustrating another step of the implementation mode of the method of forming the device of FIG. 6.

FIG. 8 is a partial simplified cross-section view illustrating another step of the implementation mode of the method of forming the device 600 of FIG. 6.

During this step, a trench 802 extending vertically towards substrate 102 from the upper surface 108T of layer 108 is formed. More precisely, in the shown example, trench 802 crosses layers 108 and 106 and partially penetrates into the thickness of layer 104. Trench 802 stops in layer 104 and does not reach the upper surface 102T of substrate 102.

As an example, trench 802 is formed by atomic layer etching (ALE).

According to an implementation mode, it is ascertained that trench 802 has oblique lateral walls, or sides, 802L and 802R. More precisely, trench 802 is for example etched so that its lateral walls 802L and 802R each form an angle α relative to a normal to the upper surface 108T of layer 108. As an example, the angle α formed by walls 802L and 802R is in the range from 5° to 45°, for example, equal to approximately 10°.

Lateral walls 802L and 802R are inclined so that trench 802 has a flared profile. More precisely, it is ascertained that trench 802 has an opening (on top, in the orientation of FIG. 8) wider than its bottom 802B (at the bottom, in the orientation of FIG. 8).

The lateral walls 802L and 802R of trench 802 form sides of the future gate region 110G of transistor 602. More precisely:

wall 802L forms the side of gate region 110G located on the side of source electrode 112S; and wall 802R, opposite to wall 802L, forms the side of gate region 110G located on the side of drain electrode 112D.

The fact of providing a trench 802 having oblique lateral walls 802L and 802R enables, when device 600 is in the conductive state, to facilitate the flowing of electrons around gate region 110G. This more precisely enables to facilitate the flowing down of electrons along the side of gate region 110G located on the side of electrode 112S, that is, parallel to wall 802L of trench 802.

The fact of providing oblique walls 802L and 802R further enables to decrease the length of the conduction path 116B (FIG. 3) under the bottom of gate region 110G. The on-state resistance Ron of transistor 602 is thus decreased.

As an example, trench 802 has:

a maximum width Lmax in the range from 0.4 to 1 µm, for example, equal to approximately 0.5 µm; and a minimum width Lmin in the range from 0.2 to 0.4 µm, for example equal to approximately 0.3 µm.

At the end of this step, the two-dimensional electron gas 2DEG is discontinuous. More precisely, trench 802 separates the two-dimensional electron gas 2DEG into two portions located on either side of trench 802. Layers 106 and 108 are further each separated into two separate layer portions located on either side of trench 802.

Figure 9:
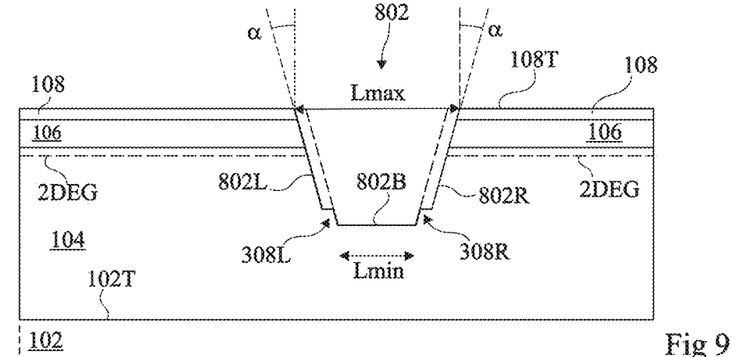
FIG. 9 is a partial simplified cross-section view illustrating still another step of the implementation mode of the method of forming the device of FIG. 6.

FIG. 9 is a partial simplified cross-section view illustrating still another step of the implementation mode of the method of forming the device 600 of FIG. 6.

During this step, shoulders 308L and 308R are formed. Trench 802 is for example widened in its upper portion only. In the shown example, a substantially constant thickness of material of layers 104, 106, and 108 is removed along the walls 802L and 802R of trench 802, except for an area located close to bottom 802B. In FIG. 9, dotted lines located inside of trench 802 symbolize the position of the walls 802L and 802R previously formed at the end of the step of FIG. 8.

The walls 802L and 802R of widened trench 802 for example have the same angle α with respect to a normal to the upper surface 108T of layer 108 as at the end of the step of FIG. 8. In the shown example, the maximum width Lmax of widened trench 802 is greater than that of the trench 802 obtained at the end of the step of FIG. 8. In this example, the minimum width Lmin of widened trench 802 is substantially equal to that of the trench 802 previously obtained at the end of the step of FIG. 8.

Figure 10:
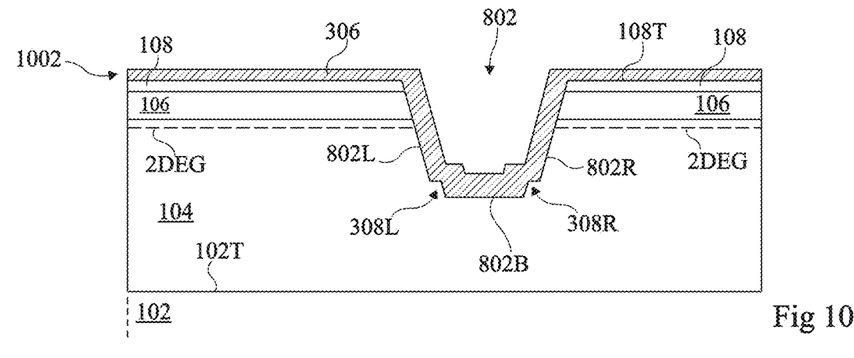
FIG. 10 is a partial simplified cross-section view illustrating still another step of the implementation mode of the method of forming the device of FIG. 6.

FIG. 10 is a partial simplified cross-section view illustrating still another step of the implementation mode of the method of forming the device 600 of FIG. 6.

During this step, conductive material 306 is deposited over the structure on the side of surface 102T of substrate 102. In the shown example, conductive material 306 forms a continuous conductive layer 1002 coating the upper surface 108T of layer 108 as well as the lateral walls 802L, 802R and the bottom 802B of trench 802.

As an example, conductive layer 1002 is formed by a conformal deposition technique, for example, by chemical vapor deposition (CVD). The presence of crystal defects is thus avoided or limited at the interface between layers 104 and 1002, these defects being likely to form trap states for electrons.

Figure 11:
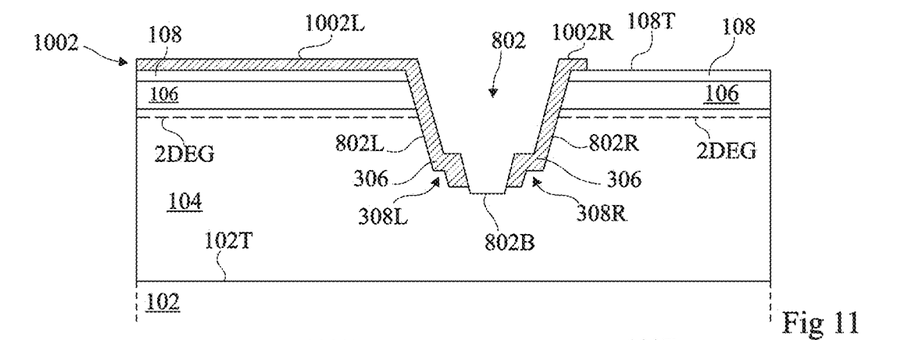
FIG. 11 is a partial simplified cross-section view illustrating still another step of the implementation mode of the method of forming the device of FIG. 6.

FIG. 11 is a partial simplified cross-section view illustrating still another step of the implementation mode of the method of forming the device 600 of FIG. 6.

During this step, conductive layer 1002 is etched to expose the bottom 802B of trench 802. A portion of layer 1002 coating the bottom 802B of trench 802 is removed for this purpose. Layer 1002 is thus separated into two separate portions.

One more precisely obtains, at the end of the etching:

a portion 1002L of conductive layer 1002, coating wall 802L of trench 802; and another portion 1002R of conductive layer 1002, coating wall 802R of trench 802 and insulated from portion 1002L.

In the shown example, layer 1002 is further etched on the side of the future electrode 112D (FIG. 6), that is, on the right-hand side in the orientation of FIG. 11, to expose a portion of the upper surface 108T of layer 108 located between the future electrode 112G and the future electrode 112D.

As an example, the portions 1002L and 1002R of conductive layer 1002 are formed by a wet etch method. This particularly enables to obtain a low roughness at the level of the bottom 802B of trench 802. The on-state resistance Ron of device 600 is thus decreased.

The wet etching may be preceded by a dry etch step, for example, plasma-enhanced. In this case, the wet etching enables to improve the surface state, obtained at the end of the dry etch step, of the bottom 802B of trench 802.

As a variant, layer 1002 may be etched so that portions 1002L and 1002R extend over a portion of the bottom 802B of trench 802. In this case, the portions 1002L and 1002R of layer 1002 each partially coat the bottom 802B of trench 802.

It is however ascertained that the portions 1002L and 1002R of conductive layer 1002 are separate. As an example, layer 1002 is etched so that portion 1002L is separated from portion 1002R by a distance sufficient to avoid any risk of breakdown due to the biasing of the drain electrode 112D (FIG. 6) of device 600. This distance is for example in the range from 100 to 300 nm.

The fact of continuing portions 1002L and 1002R of layer 1002 on the bottom 802B of trench 802 enables to avoid or to limit the occurrence of edge effects tending to increase the on-state resistance Ron of device 600.

Figure 12:
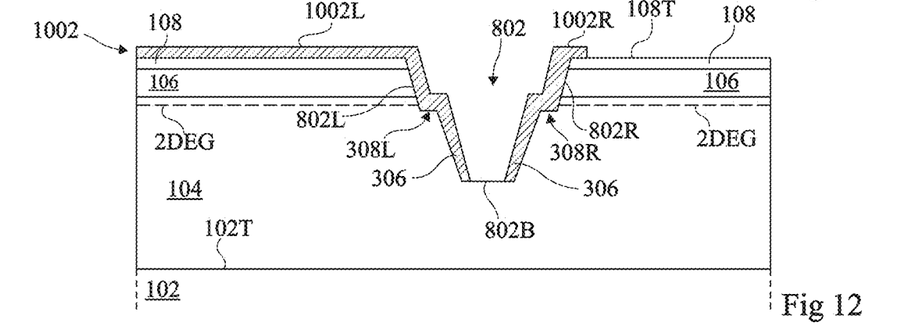
FIG. 12 is a partial simplified cross-section view illustrating a variant of the implementation mode of the method of forming the device of FIG. 6.

FIG. 12 is a partial simplified cross-section view illustrating a variant of the implementation mode of the method of forming the device 600 of FIG. 6. FIG. 12 more precisely illustrates a variant of the structure obtained at the end of the step of FIG. 11.

In the shown example, shoulders 308 and 308R are approximately located at the level of the bidirectional electron gas 2DEG, that is, close to the interface between layers 104 and 106. The structure illustrated in FIG. 12 is for example obtained by etching the sides 802L and 802R of trench 802 on their upper portion only, and then by depositing layer 1002 of conductive material 306 and by etching this layer similarly to what has been previously discussed in relation with FIG. 11.

In the following description, it is assumed that the variant discussed in relation with FIG. 12 is not retained. However, the adaptation of the steps discussed hereafter to the variant of FIG. 12 is within the abilities of those skilled in the art.

Figure 13:
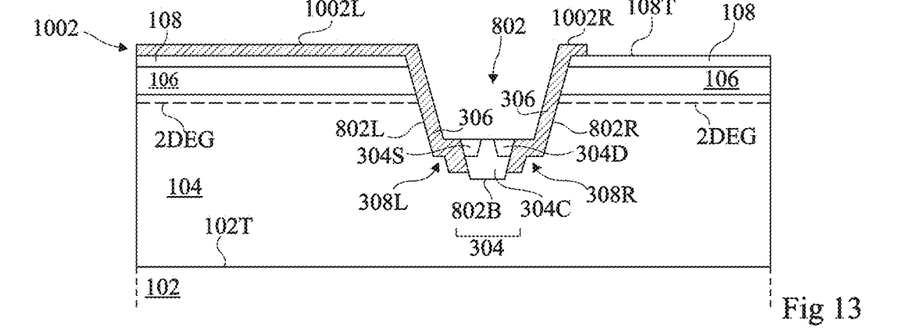
FIG. 13 is a partial simplified cross-section view illustrating still another step of the implementation mode of the method of forming the device of FIG. 6.

FIG. 13 is a partial simplified cross-section view illustrating still another step of the implementation mode of the method of forming the device 600 of FIG. 6.

During this step, transistor 304 is formed. As an example, a layer made of a semiconductor material, for example, silicon, is deposited on the structure on the side of the upper surface 102T of substrate 102. This layer is then etched to only keep a layer portion coating the bottom 802B of trench 802 discussed at the end of the step of FIG. 11. The region 304C of transistor 304 is thus obtained. In the shown example, region 304C is located on top of and in contact with a portion of the bottom 802B of trench 802 and is interposed between the portions 1002L and 1002R of conductive layer 1002.

Region 304C is then doped to form the source and drain regions 304S and 304D of transistor 304. As an example, the doping is performed by local ion implantation.

In the shown example, transistor 304 partially fills trench 802. As a variant, for example, if a device similar to the device 500 of FIG. 5 is desired to be formed, transistor 304 fills trench 802.

Figure 14:
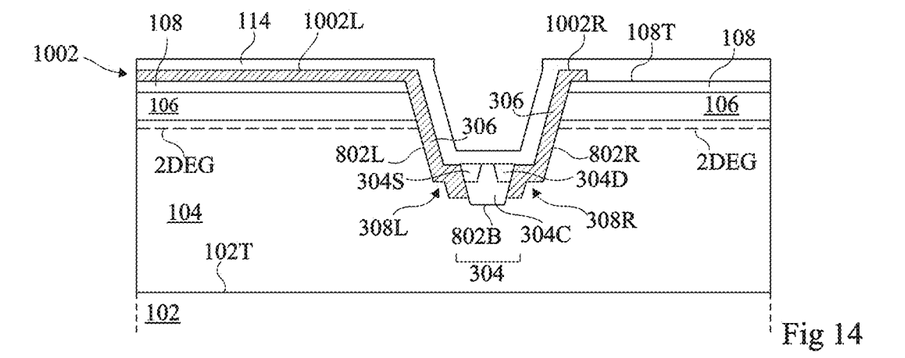
FIG. 14 is a partial simplified cross-section view illustrating still another step of the implementation mode of the method of forming the device of FIG. 6.

FIG. 14 is a partial simplified cross-section view illustrating still another step of the implementation mode of the method of forming the device 600 of FIG. 6.

During this step, insulating layer 114 is deposited on the structure on the side of surface 102T of substrate 102.

Based on the structure described in relation with FIG. 14, electrodes 112S, 112G, and 112D are then formed to obtain the device 600 discussed in relation with FIG. 6. As an example, electrodes 112S, 112G, and 112D are obtained by deposition and then local etching of a metal layer (not shown) coating the upper surface of insulating layer 114. The gate electrode 112G of transistor 600 (FIG. 6) is more precisely formed inside of trench 802, the sides 118L and 118R of electrode 112G thus being substantially parallel to the walls 802L and 802R of trench 802.

As a variant, the deposition of insulating layer 114 is followed by an etching operation aiming at removing a portion of insulating layer 114 coating transistor 304. This etching operation is for example followed by an operation of deposition of another conductive layer on the structure, on the side of surface 102T of substrate 102. As an example, this insulating layer is made of the same material as insulating layer 114. In this variant, an overthickness of insulating material is obtained along the walls 802L and 802R of trench 802 with respect to bottom 802B. This advantageously provides a high insulation between electrode 112G and layer 104 enabling to decrease parasitic capacitances Cgs and Cgd (FIG. 1) by approximately 40 to 45% with respect to transistor 100. A relatively low threshold voltage Vth, for example, in the order of 1 V, and mainly controlled by the bottom 118B of gate electrode 112G, is however kept, conversely to a case where the bottom 118B of electrode 112G of transistor 602 would be coated with a greater thickness of insulating material.

Various embodiments, implementation modes, and variants have been described. Those skilled in the art will understand that certain features of these various embodiments, implementation modes, and variants, may be combined and other variants will occur to those skilled in the art.

Based on the above indications, it will in particular be within the abilities of those skilled in the art to provide devices similar to devices 300 and 500 but comprising a connection between source electrode 112S and conductive material 306 on the side 118L of gate electrode 112G.

The adaptation of the method of forming the device 600 described in relation with FIGS. 7 to 14 to obtain the devices 300, 400, and 500 of FIGS. 3, 4, and 5 as well as the transistors of the other embodiments and variants of the above paragraphs, is also within the abilities of those skilled in the art.

Finally, the practical implementation of the described embodiments, implementation modes, and variants is within the abilities of those skilled in the art based on the functional indications given hereabove. In particular, it will be within the abilities of those skilled in the art to select conductive material 306, as well as the material and the doping rate of each of the regions 304S, 304D, and 304C of transistor 304, according to the targeted application.

The invention claimed is:

1. Device comprising:
    a first high electron mobility transistor comprising:
        a first gallium nitride layer;
        a second layer made of a first semiconductor material located on top of and in contact with the first layer, so that an electrode gas can form at an interface between the first and second layers; and
        a first gate region crossing the second layer and partially penetrating into the first layer; and
    a second transistor located inside of the first region and comprising:
        second and third regions made of a second doped semiconductor material of a first conductivity type, the second semiconductor material being different from gallium nitride; and
        a fourth channel region made of the second semiconductor material, non intentionally doped or doped with a second conductivity type opposite to the first conductivity type, interposed between the second and third regions, wherein a conductive material extends along a first side of a vertical portion of the first region and contacts the second region.

2. Device according to claim 1, wherein the second semiconductor material is silicon.

3. Device according to claim 1, wherein the conductive material further extends along a second side, opposite to the first side, of the vertical portion of the first region and contacts the third region.

4. Device according to claim 1, wherein the first transistor comprises a first gate electrode located above the second transistor and insulated from the second transistor by a third insulating layer.

5. Device according to claim 4, wherein the first transistor further comprises second and third electrodes, located on either side of the first electrode and partially penetrating into the first layer, the second electrode being closer to the first electrode than the third electrode and the first side being located on the side of the second electrode.

6. Device according to claim 5, wherein the conductive material extending along the first side extends all the way to the second electrode.

7. Device according to claim 5, wherein the conductive material integrally coats a side of the second region located on the side of the second electrode.

8. Device according to claim 4, wherein the first electrode is planar and located on top of and in contact with the third insulating layer, a first side of the second transistor being coated with the conductive material.

9. Device according to claim 8, wherein the second transistor occupies the vertical portion of the gate region of the first transistor, the fourth channel region crossing the second layer and partially penetrating into the first layer.

10. Device according to claim 4, wherein the first electrode partially penetrates into the first layer, a first side of the first electrode being coated with the third insulating layer and with the conductive material.

11. Device according to claim 10, wherein the second transistor is located in a lower portion of the gate region of the first transistor.

* * * * *